US006975953B2

(12) United States Patent
Kadota

(10) Patent No.: US 6,975,953 B2
(45) Date of Patent: Dec. 13, 2005

(54) ANALYSIS METHOD FOR SEMICONDUCTOR DEVICE, ANALYSIS SYSTEM AND A COMPUTER PROGRAM PRODUCT

(75) Inventor: Kenichi Kadota, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 21 days.

(21) Appl. No.: 10/784,939

(22) Filed: Feb. 25, 2004

(65) Prior Publication Data

US 2004/0228186 A1    Nov. 18, 2004

(30) Foreign Application Priority Data

Feb. 25, 2003   (JP)   ............................ P2003-048090

(51) Int. Cl.[7] .......................... G01R 31/00; G06F 11/30
(52) U.S. Cl. .................. 702/117; 702/183; 714/48; 700/73; 700/121
(58) Field of Search .................. 702/117, 108, 185, 702/183; 700/121, 73, 110; 714/37, 48

(56) References Cited

U.S. PATENT DOCUMENTS

| | | | | |
|---|---|---|---|---|
| 5,274,434 A | * | 12/1993 | Morioka et al. | 356/237.4 |
| 5,726,920 A | * | 3/1998 | Chen et al. | 702/108 |
| 6,782,348 B2 | * | 8/2004 | Ushiku | 702/183 |
| 6,862,484 B2 | * | 3/2005 | Hayashi | 700/73 |

FOREIGN PATENT DOCUMENTS

| | | |
|---|---|---|
| JP | 10-270521 | 10/1998 |
| JP | 2000-110867 | 4/2000 |
| JP | 2001-110867 | 4/2001 |
| JP | 2002-203882 | 7/2002 |
| JP | 2003-037143 | 2/2003 |

OTHER PUBLICATIONS

Taguchi, "Mathematics for Quality Engineering," Japanese Standards Association (1999), pp. 131-156.
Notice of Grounds for Rejection, issued by the Japanese Patent Office, mailed Jul. 5, 2005, in Japanese Application No. P2003-048090, and English-language translation thereof.

* cited by examiner

Primary Examiner—Bryan Bui
Assistant Examiner—Hien Vo
(74) Attorney, Agent, or Firm—Finnegan, Henderson, Farabow, Garrett & Dunner, L.L.P.

(57) ABSTRACT

An analysis method for a semiconductor device includes measuring electrical characteristics of TEGs fabricated on a semiconductor substrate; classifying the TEGs into a first TEG category where a systematic failure has not occurred and a second TEG category where the systematic failure has occurred based on the electrical characteristics; creating a first comparison Mahalanobis reference space using first parameters of the TEGs in the first TEG category from among parameters of the TEGs expressed as numerical values; calculating a first comparison Mahalanobis distance of the first parameters and a second comparison Mahalanobis distance of second parameters of the TEGs in the second TEG category by using the first comparison Mahalanobis reference space; and comparing the first and second comparison Mahalanobis distances.

20 Claims, 11 Drawing Sheets

FIG. 3

| TEG | LINE WIDTH | SPACE WIDTH | WIRING DENSITY | WIRING COVERAGE | LOWER LAYER WIRING DENSITY | SYSTEMATIC FAILURE |
|---|---|---|---|---|---|---|
| TEG1 | 0.1 | 0.3 | 0.6 | 0.3 | 0.8 | × |
| TEG2 | 0.2 | 0.2 | 0.7 | 0.3 | 0.5 | ○ |
| TEG3 | 0.2 | 0.2 | 0.3 | 0.4 | 0.4 | ○ |
| TEG4 | 0.15 | 0.25 | 0.2 | 0.6 | 0.2 | ○ |
| TEG5 | 0.15 | 0.25 | 0.1 | 0.2 | 0.1 | ○ |
| TEG6 | 0.15 | 0.25 | 0.4 | 0.7 | 0.4 | ○ |
| TEG7 | 0.3 | 0.1 | 0.8 | 0.5 | 0.7 | × |
| TEG8 | 0.3 | 0.1 | 0.6 | 0.6 | 0.5 | ○ |
| TEG9 | 0.3 | 0.1 | 0.3 | 0.2 | 0.3 | ○ |
| TEG10 | 0.3 | 0.1 | 0.7 | 0.1 | 0.8 | × |
| . | . | . | . | . | . | . |
| . | . | . | . | . | . | . |
| . | . | . | . | . | . | . |

FIG. 6

| TEG | LOWER LAYER LINE WIDTH | UPPER LAYER LINE WIDTH | LOWER LAYER SPACE WIDTH | UPPER LAYER SPACE WIDTH | LOWER LAYER FRINGE WIDTH | UPPER LAYER FRINGE WIDTH | VIA SCALE | VIA PERIOD | VIA OPENING RATIO | SYSTEMATIC FAILURE |
|---|---|---|---|---|---|---|---|---|---|---|
| TEG11 | 0.15 | 0.15 | 0.15 | 0.15 | 0.03 | 0.03 | 10000 | 0.5 | 4.0% | × |
| TEG12 | 0.2 | 0.2 | 0.2 | 0.2 | 0.04 | 0.04 | 10000 | 0.5 | 3.0% | ○ |
| TEG13 | 0.3 | 0.3 | 0.3 | 0.3 | 0.06 | 0.06 | 10000 | 0.5 | 3.0% | ○ |
| TEG14 | 0.15 | 0.2 | 0.15 | 0.2 | 0.03 | 0.04 | 10000 | 0.5 | 2.5% | ○ |
| TEG15 | 0.2 | 0.2 | 0.2 | 0.2 | 0.04 | 0.04 | 1000 | 20 | 0.5% | × |
| TEG16 | 0.2 | 0.2 | 0.2 | 0.2 | 0.04 | 0.04 | 1000 | 10 | 0.3% | ○ |
| TEG17 | 0.2 | 0.2 | 0.2 | 0.2 | 0.04 | 0.04 | 1000 | 5 | 0.2% | ○ |
| TEG18 | 0.2 | 0.2 | 0.2 | 0.2 | 0.04 | 0.04 | 1000 | 1 | 0.4% | ○ |
| ･･･ | ･･･ | ･･･ | ･･･ | ･･･ | ･･･ | ･･･ | ･･･ | ･･･ | ･･･ | ･･･ |

ANALYSIS METHOD FOR SEMICONDUCTOR DEVICE, ANALYSIS SYSTEM AND A COMPUTER PROGRAM PRODUCT

CROSS REFERENCE TO RELATED APPLICATIONS

This application is based upon and claims the benefit of priority from prior Japanese Patent Application P2003-048090 filed on Feb. 25, 2003; the entire contents of which are incorporated by reference herein.

BACKGROUND OF THE INVENTION

1. Field of the Invention

The present invention relates to an analysis method for a semiconductor device in a manufacturing process thereof, an analysis system, and a computer program product.

2. Description of the Related Art

Along with advances in multifunction semiconductor devices such as a semiconductor integrated circuit, reduction of pattern dimensions and large-scale integration are in constant demand. It is necessary to manufacture such a semiconductor device in a plurality of chip regions on a semiconductor substrate with a uniform performance and a high manufacturing yield. In a manufacturing method for the semiconductor device, various manufacturing processes are used. In order to improve the manufacturing yield of the semiconductor device, it is necessary to improve a yield rate for each of the manufacturing processes. Hence, failure analysis occurring in the semiconductor device due to the manufacturing processes is important.

For the purpose of achieving an optimum condition for a manufacturing process of the semiconductor device, developing a new process, controlling a process, or the like, the manufacturing process is often evaluated using a test pattern formed on a semiconductor substrate. Usually, the failure analysis of test element group (TEG) data is implemented by use of various types of TEGs fabricated on a chip or a wafer for evaluating the manufacturing processes. Failures that occur in a manufacturing process are classified into a systematic failure due to the manufacturing process and a random failure which accidently occurs. In the TEG failure analysis, the systematic failure is classified from among the failures occurring in the TEG in order to extract problems in the manufacturing process associated with the systematic failure. A method is known for controlling the quality of a semiconductor device where non-defective chips in the semiconductor substrate are extracted and a relationship between a yield rate for electrical characteristics of TEGs in the non-defective chips and parameters of the manufacturing process is analyzed to identify the cause of deterioration of a manufacturing yield by the systematic failure (refer to Japanese Patent Laid-Open Application No. 2001-110867).

In development of a manufacturing process of a semiconductor device, currently, failures in each particular TEG fabricated on a chip or a wafer are analyzed by empirical methods to estimate the reason for a systematic failure. However, it is difficult to identify a parameter closely related to the failures by a method based on failure analysis of each particular TEG. Thus, there is a possibility that an underlying problem of the manufacturing process may not be detected and, thereby, be unidentified.

SUMMARY OF THE INVENTION

A first aspect of the present invention inheres in an analysis method for a semiconductor device, including: measuring electrical characteristics of a plurality of test element groups fabricated on a semiconductor substrate; expressing parameters of each of the test element groups as numerical values; classifying the test element groups into a first test element group category where a systematic failure has not occurred and a second test element group category where the systematic failure has occurred based on the electrical characteristics; creating a comparison Mahalanobis reference space using the parameters of the test element groups in the first test element group category from among the parameters expressed as numerical values; calculating a first comparison Mahalanobis distance of the first test element group category and a second comparison Mahalanobis distance of the second test element group category by using the comparison Mahalanobis reference space; and comparing the first and second comparison Mahalanobis distances.

A second aspect of the present invention inheres in an analysis system, including: a failure classification module configured to classify test element groups into a first test element group category where a systematic failure has not occurred and a second test element group category where the systematic failure has occurred based on measurement results of electrical characteristics of the test element groups; and a statistical analysis module configured to create a first comparison Mahalanobis reference space using first parameters of the test element groups in the first test element group category from among parameters of the test element groups expressed as numerical values, and to calculate a first comparison Mahalanobis distance of the first parameters and a second comparison Mahalanobis distance of second parameters of the test element groups in the second test element group category by using the first comparison Mahalanobis reference space, so as to compare the first and second comparison Mahalanobis distances.

A third aspect of the present invention inheres in a computer program product configured to be executed by a computer, including: an instruction of classifying test element groups into a first test element group category where a systematic failure has not occurred and a second test element group category where the systematic failure has occurred based on measurement results of electrical characteristics of the test element groups; an instruction of creating a first comparison Mahalanobis reference space using first parameters of the test element groups in the first test element group category from among parameters of the test element groups expressed as numerical values; and an instruction of calculating a first comparison Mahalanobis distance of the first parameters and a second comparison Mahalanobis distance of second parameters of the test element groups in the second test element group category by using the first comparison Mahalanobis reference space so as to compare the first and second comparison Mahalanobis distances.

BRIEF DESCRIPTION OF DRAWINGS

FIG. 3 is a view of an example of a table of quantified parameters of a TEG used in the analysis method according to the embodiment of the present invention;

FIG. 6 is a view of an example of another table of quantified parameters of a TEG used in the analysis method according to the embodiment of the present invention;

DETAILED DESCRIPTION OF THE INVENTION

Figure 1:
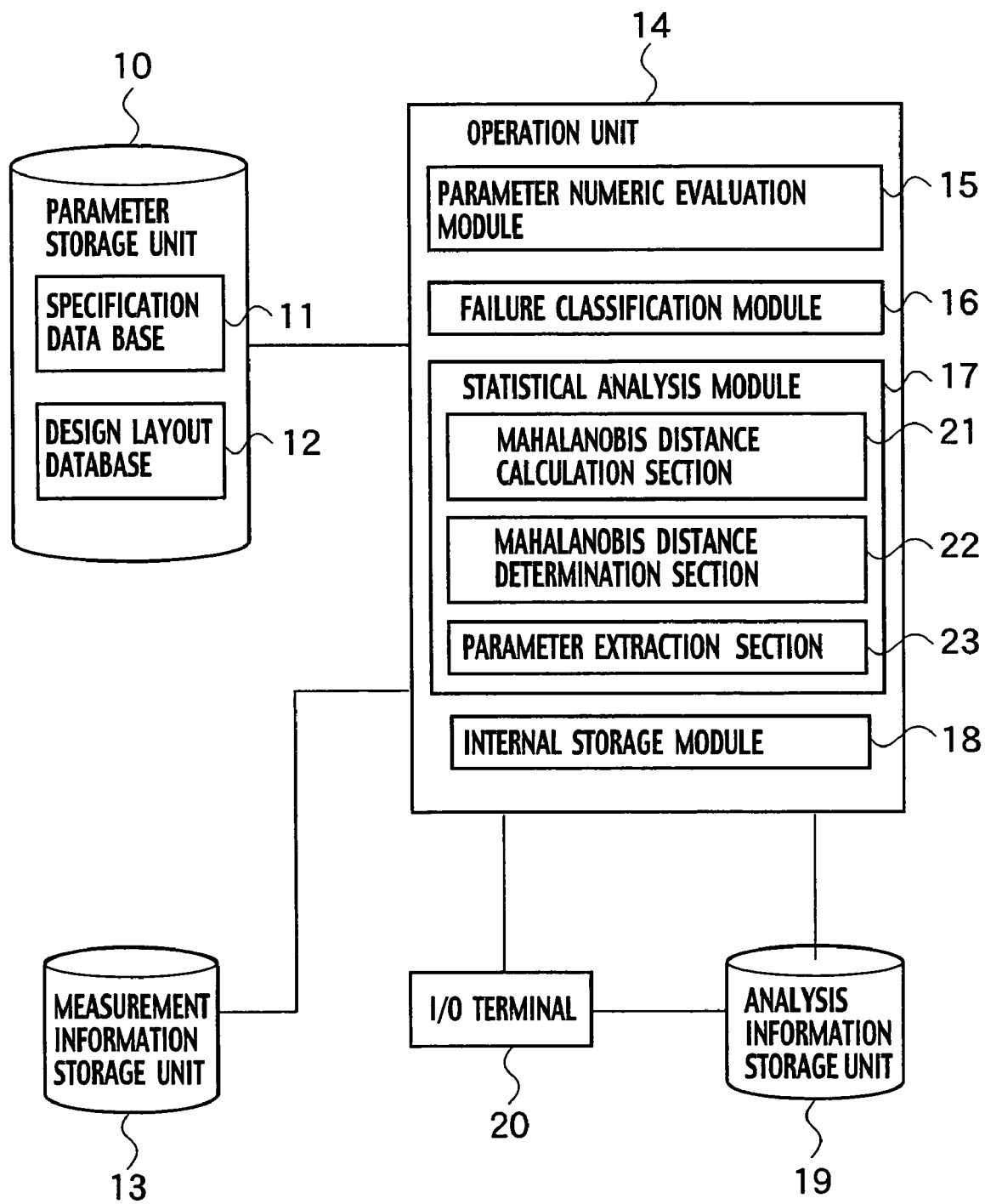
FIG. 1 is a block diagram showing an example of the configuration of an analysis system according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

An analysis system according to an embodiment of the present invention, as shown in FIG. 1, is provided with a parameter storage unit 10 including a specification database 11 and a design layout database 12, respectively storing a specification and a design layout of a TEG used in a failure analysis procedure, a measurement information storage unit 13 storing measurement results of various characteristics of the fabricated TEG, an operation unit 14 implementing the failure analysis, an analysis information storage unit 19 storing computing results, and an input/output (I/O) terminal 20. The operation unit 14 includes a parameter numeric evaluation module 15 configured to express a parameter of the TEG as a numerical value based on the specification and the design layout stored in the parameter storage unit 10, a failure classification module 16 configured to classify the TEG where a systematic failure has occurred due to a process, a statistical analysis module 17 configured to implement a parameter analysis of the TEG, and an internal storage module 18 storing a program code for executing the failure analysis procedure of the TEG. Moreover, the statistical analysis module 17 includes a Mahalanobis distance calculation section 21, a Mahalanobis distance determination section 22, and a parameter extraction section 23 of the TEG parameter. The operation unit 14 is provided by a central processing unit (CPU) of a computer.

In the failure analysis procedure according to the embodiment of the present invention, for example, an open-short TEG, a via chain TEG, and the like, of several hundred types of TEGs varying in sizes and scales, are used.

Figure 2:
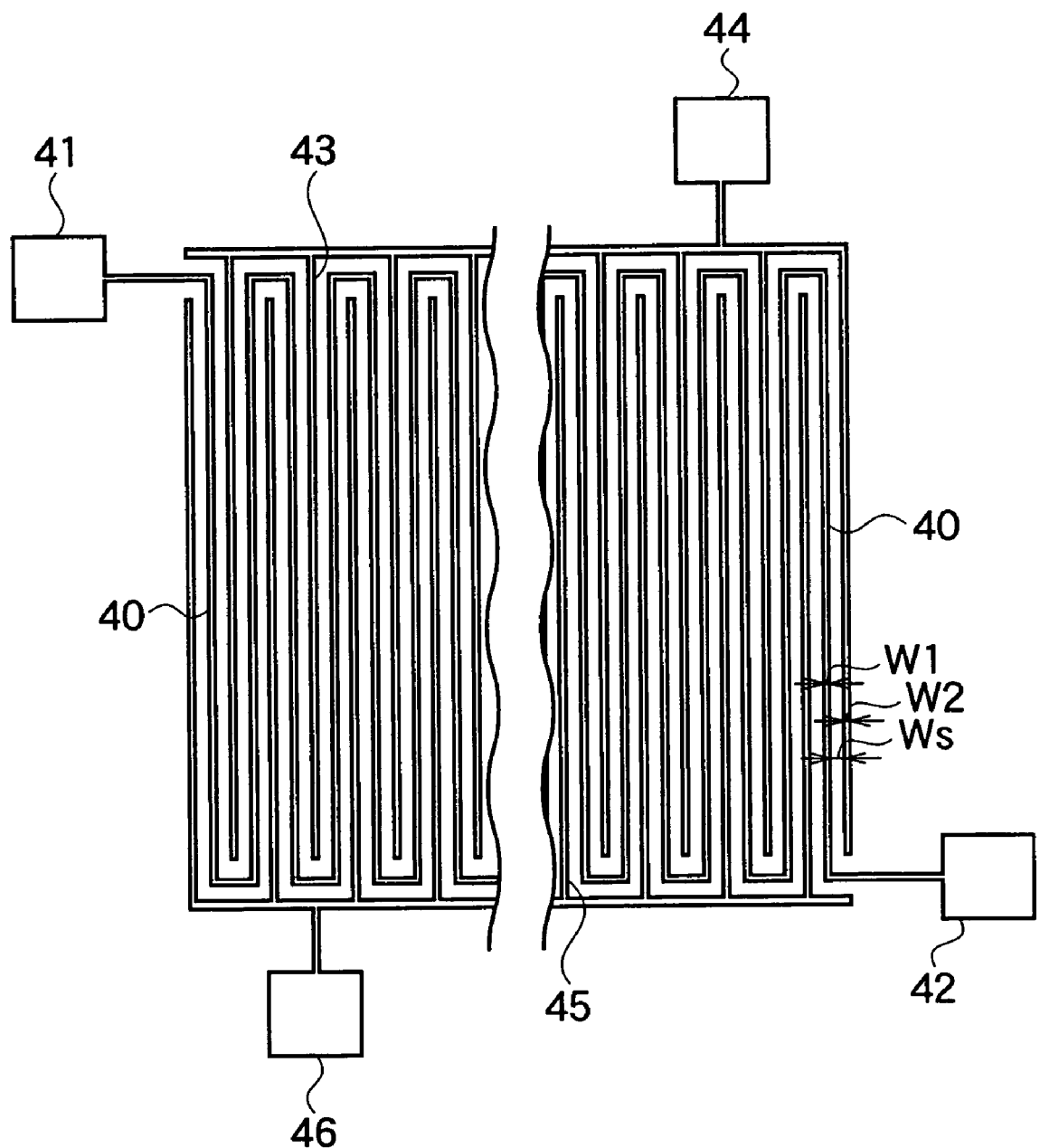
FIG. 2 is a schematic view of an open-short TEG used in an analysis method for a semiconductor device according to the embodiment of the present invention.

The open-short TEG is used for examining disconnection of the wiring (open) formed on a plane and presence of a short-circuit of the wiring (short). The open-short TEG, as shown in FIG. 2, includes a main line 40 provided, for example, so as to be folded over laterally in the drawing, which has a line width W1 and is fabricated by a conductor such as copper (Cu) or aluminum (Al), and comb-shaped ancillary lines 43 and 45 provided so as to be inserted upwardly and downwardly in spaces between the folded main line 40, respectively as shown in the drawing. The lines 43 and 45 have a line width W2 and are fabricated by a conductor such as copper (Cu) or aluminum (Al). The space width between the main line 40 and the ancillary lines 43, 45 is Ws. For measuring electrical characteristics, main pads 41 and 42 are connected to both ends of the main line 40, and ancillary pads 44 and 46 are connected to the ancillary lines 43, 45. An open failure is defined as no electrical conduction between the main pads 41 and 42. A short failure is defined as electrical conduction between the main pads 41, 42 and the ancillary pads 44, 46. The open-short TEG is provided on each interlevel dielectric film deposited one upon another.

The parameters of the open-short TEG include line dimensions such as a line length and the line width W1 of the main line 40, the space width Ws between the main line 40 and the ancillary lines 43, 45, and the line width W2 of the ancillary lines 43, 45; a wiring density defined as the line length per unit area including any surrounding region; a wiring coverage rate on a surface of any surrounding region; a coordinate of the TEG in a chip; a coordinate of the chip including the TEG in a semiconductor substrate; wiring densities of TEGs placed on an upper layer and a lower layer; and wiring coverage rates of the TEGs placed on the upper layer and the lower layer.

The parameters of the open-short TEG that are determined as being useful as an analysis target are, for example, properly selected as shown in FIG. 3. The parameter numeric evaluation module 15 of FIG. 1 expresses the selected parameters as numerical values based on the specification and the design layout data stored in the specification database 11 and the design layout database 12.

Figure 4:
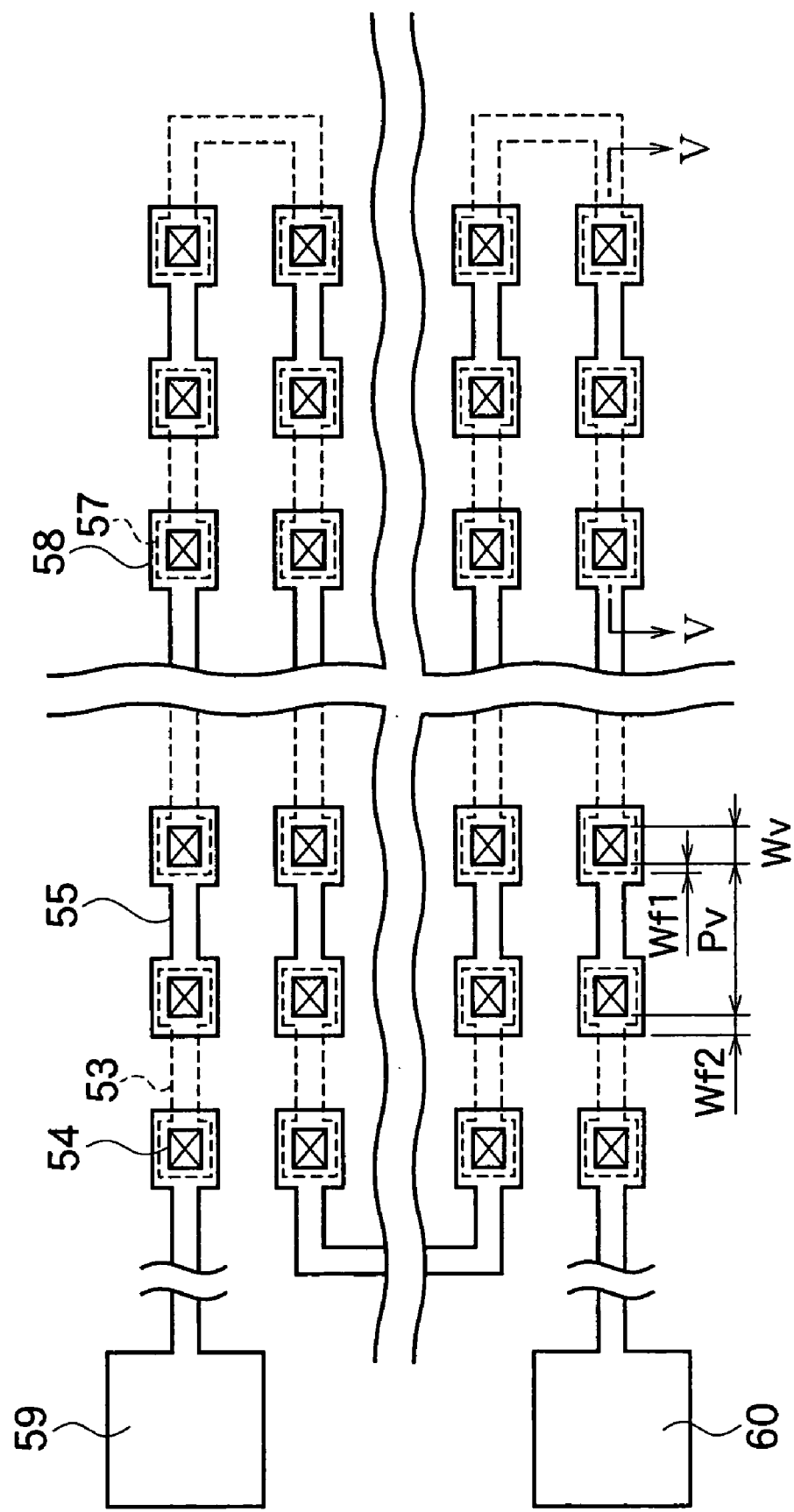
FIG. 4 is a schematic plan view of a via chain TEG used in the analysis method according to the embodiment of the present invention.

The via chain TEG, as shown in FIG. 4, is used for examining electrical conduction of a via chain where lower layer wiring 53 and upper layer wiring 55 are connected in a chain shape by via plugs 54. The via chain TEG, as shown in the cross-sectional view taken along line V—V in FIG. 5, has a plurality of lower layer wirings 53 formed by a conductor such as Cu or Al which are placed on a surface of a first interlevel dielectric film 51 such as a silicon oxide ($SiO_2$) film on an upper part of a semiconductor substrate 30; a plurality of upper layer wirings 55 formed by a conductor such as Cu or Al on a surface of an second interlevel dielectric film 52 such as an $SiO_2$ film on the first interlevel dielectric film 51; and via plugs 54 made of a conductor such as Cu or tungsten (W) connecting the lower layer wirings 53 and the upper layer wirings 55 to form the via chain. Moreover, in order to passivate the upper layer wirings 55, a passivation dielectric film 56 such as a silicon nitride film ($Si_3N_4$) is provided on a surface of the second interlevel dielectric film 52.

Figure 5:
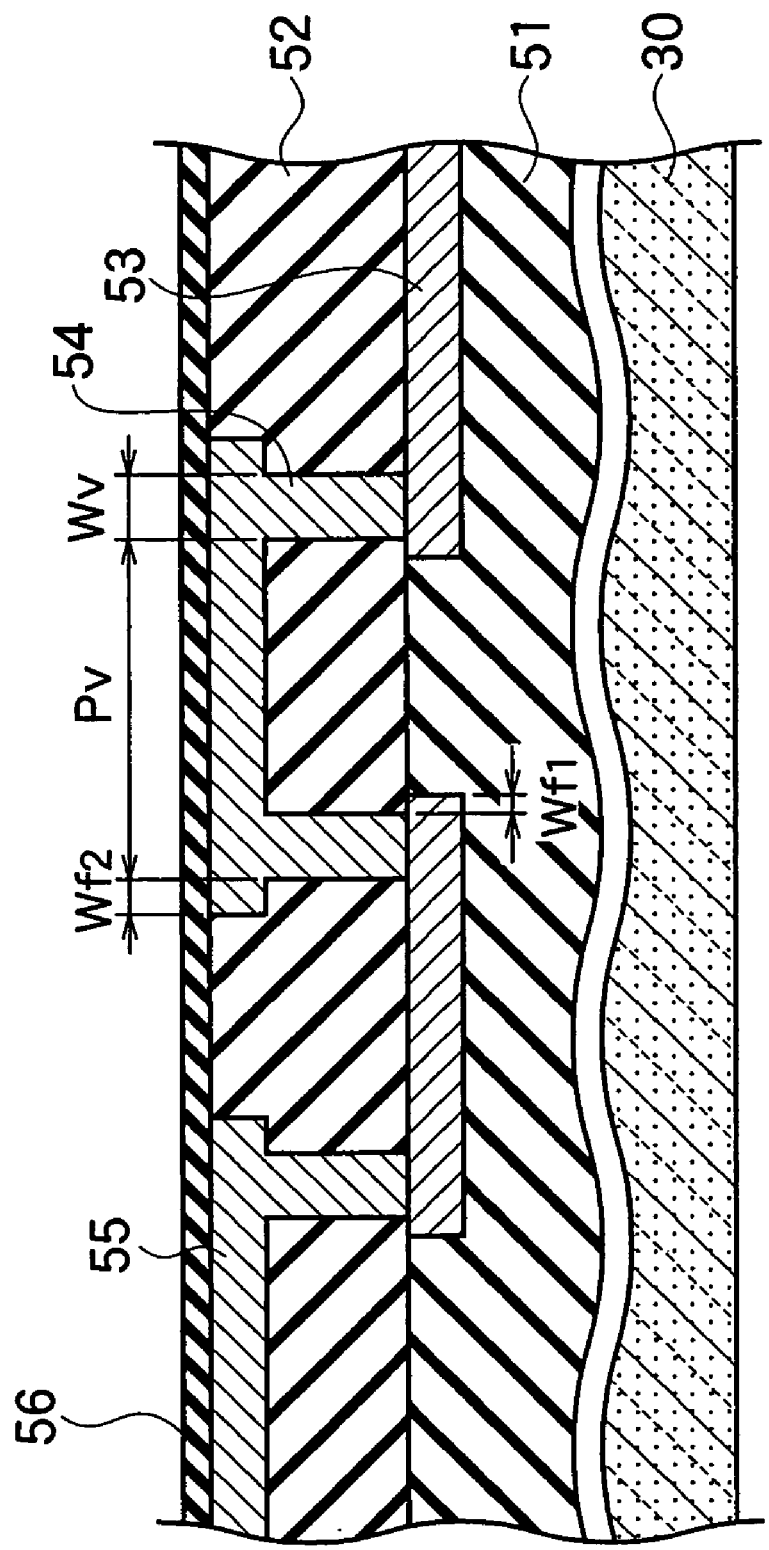
FIG. 5 is a schematic cross-sectional view of the via chain TEG used in the analysis method according to the embodiment of the present invention.

In FIG. 5, an example having two wiring layers of the upper layer wirings 55 and lower layer wirings 53 is used for explanation. However, needless to say, the above-mentioned description is also applicable to a case having a multi-layer structure with three or more layers. Specifically, any one of the dielectric films from among a plurality of interlevel dielectric films and a field oxide film forming a multi-layer structure can be selected as the first interlevel dielectric film 51. A dielectric film immediately above the first interlevel dielectric film 51 is selected as the second interlevel dielectric film 52. For example, in FIG. 5, the second interlevel dielectric film 52 is shown as the uppermost interlevel dielectric film under the passivation dielectric film 56.

As shown in FIG. 4, a lower layer fringe 57 and an upper layer fringe 58 are provided at both ends of the lower layer wiring 53 and the upper layer wiring 55 which are connected with the via plugs 54. The lower layer fringe 57 and the upper layer fringe 58 have line widths larger than a via size Wv by an amount of a lower layer fringe width Wf1 and an upper layer fringe width Wf2, respectively. The via plugs 54 are located at a constant via period Pv, and pads 59, 60 for measuring electrical characteristics are provided at both ends of the via chain. If there is no electrical conduction between the pads 59, 60, then it is determined that a failure has occurred therein.

The parameters of the via chain TEG include line dimensions of the lower layer wiring 53 and the upper layer wiring 55 such as a line length, a line width and a space width; a wiring density defined as the line length per unit area including any surrounding region; a wiring coverage rate on a surface of any surrounding region; a coordinate of the TEG in a chip; a coordinate of the chip including the TEG in a semiconductor substrate; wiring densities of TEGs placed on an upper layer and a lower layer; wiring coverage rates of the TEGs placed on the upper layer and the lower layer; the lower layer fringe and upper layer; the lower and upper layer fringe widths Wf1, Wf2; the via period Pv; a via scale defined as the number of via plugs 54 contained in the via chain; and a via opening ratio per unit area calculated from the via size Wv. The parameters of the via chain TEG that are determined as being useful as an analysis target, for example, are properly selected as shown in FIG. 6. The parameter numeric evaluation module 15 of FIG. 1 expresses the selected parameters as numerical values based on the specification and the design layout data stored in the specification database 11 and the design layout database 12.

Figure 7:
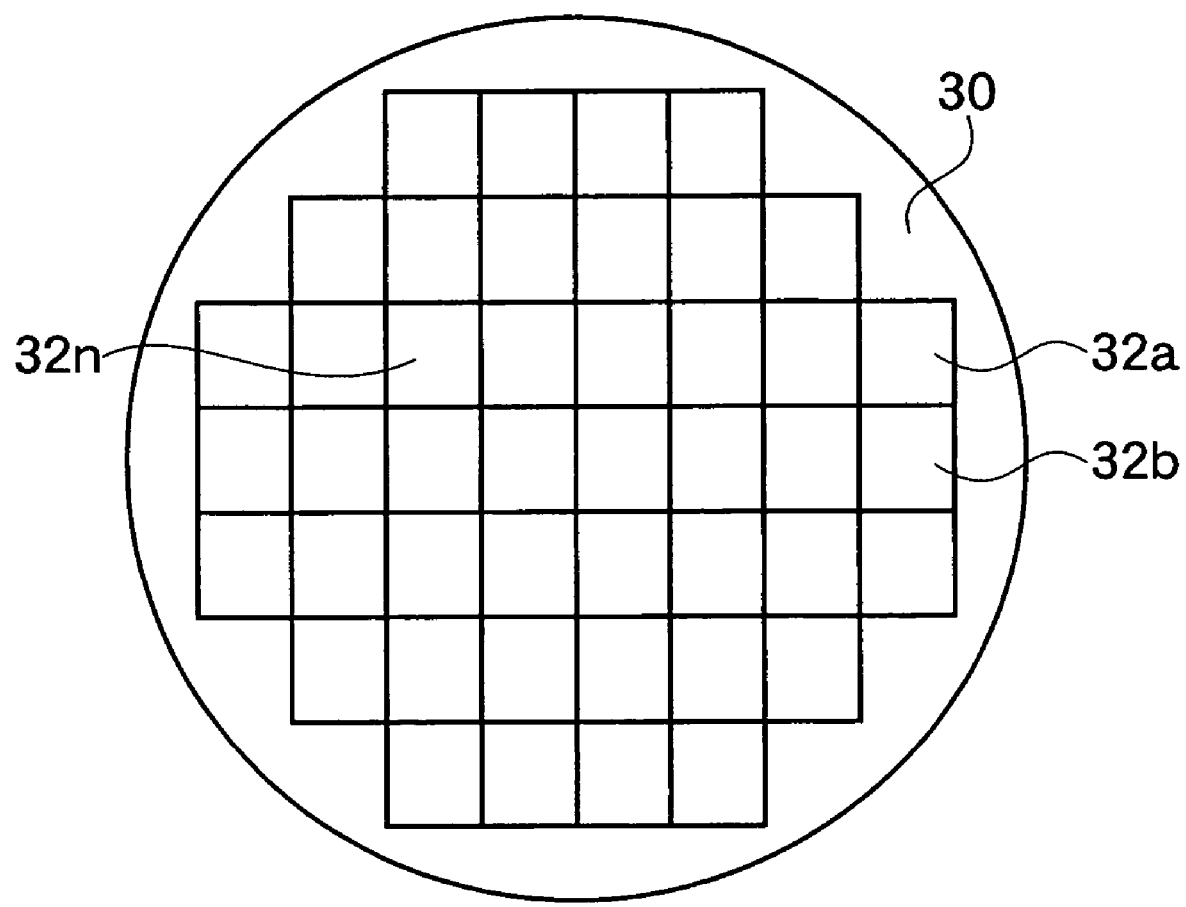
FIG. 7 is an outline view of chip regions of a semiconductor substrate fabricating TEGs used in the analysis method according to the embodiment of the present invention.

In the embodiment of the present invention, the patterns of the TEGs are fabricated by use of photo masks that are produced based on the specification and the design layout of the TEGs. Dedicated photo masks having only TEG mask patterns thereon may be used. Alternatively, photo masks for manufacturing which have the TEG mask patterns together with mask patterns for a semiconductor device of a chip may be used. In the case of the photo masks for manufacturing, the TEG mask patterns are located, for example, in mask patterns of dicing lines and the like where the mask patterns of the semiconductor device are not formed. The TEG mask patterns fabricated on the photo masks are transferred by using a reduction projection aligner on a plurality of chip regions 32a, 32b, . . . , 32n, . . . on the semiconductor substrate 30 as shown in FIG. 7. For the patterns of the TEGs fabricated by semiconductor manufacturing processes on each of the chip regions 32a, 32b, . . . , 32n, . . . , the electrical characteristics are measured by use of an inspection apparatus such as a prober so as to check the quality. Then, measurement results are classified according to the type of TEG patterns and stored in the measurement information storage unit 13 for each type of TEG patterns.

By use of the measurement results stored in the measurement information storage unit 13, the failure classification module 16 determines the presence of a systematic failure due to a manufacturing process so as to classify a first TEG category where a systematic failure has not occurred and a second TEG category where a systematic failure has occurred. For each type of TEG patterns, occurrence of a systematic failure may be determined by (i) whether a manufacturing yield is less than or equal to a reference value, (ii) whether a failure rate converted by a critical area or the via scale is not less than a reference value, (iii) whether a deviation in the surface of the semiconductor substrate 30 the reason for a failure, and the like. Here, the "critical area" refers to a distribution of the failure rate calculated by the wiring density and a distribution of the particle diameter of defect creating particles, such as dust.

After classification of the systematic failure by the failure classification module 16, the statistical analysis module 17 statistically processes the first TEG category and the second TEG category in order to implement a failure analysis. The Mahalanobis distance calculation section 21 of the statistical analysis module 17 creates a Mahalanobis reference space from the parameter values of the first TEG category. The Mahalanobis reference space is expressed as an inverse matrix $a_{ij}$ of a matrix of correlation coefficients between the parameters of the TEGs. The Mahalanobis distance calculation section 21 calculates each Mahalanobis distances of the first TEG category and the second TEG category by using the Mahalanobis reference space based on the following equation.

$$D^2 = \frac{1}{k}\sum_{ij} a_{ij}\left(\frac{X_i - m_i}{\sigma_i}\right)\left(\frac{X_j - m_j}{\sigma_j}\right) \qquad (1)$$

where k is a number of the target parameters of the TEG for the failure analysis, $X_i$ is a design value of a target parameter i (i=1 to k), and $m_i$, $\sigma_i$ are respectively an average and a standard deviation of the design value $X_i$ of the parameter i.

The Mahalanobis distance determination section 22 compares the first TEG category with the second TEG category so as to determine whether the target parameters of the TEGs are appropriately selected. When the Mahalanobis distance of the second TEG category is larger than that of the first TEG category by a significant amount, the Mahalanobis distance determination section 22 determines that the selected target parameters are appropriate.

When it is confirmed that the Mahalanobis distance of the first TEG category differs from that of the second TEG category, a TEG parameter related to the systematic failure is extracted by using a quality engineering method. In the quality engineering method, multiple parameters are evaluated at the same time by use of an orthogonal array. The "orthogonal array" is an assignment table created so that for a specific level assigned to any controlled parameter, every level of other controlled parameters all appear the same number of times. Based on the orthogonal array, for the level of each of the parameters, characteristic values are calculated to obtain a signal to noise ratio (S/N ratio) $\eta$ for a larger-is-better characteristic, and then a parameter having a larger gain of the S/N ratio $\eta$ is extracted. The "larger-is-better characteristic" is defined as a quality characteristic which does not take a negative value and the larger a value, the better. The S/N ratio $\eta$ is usually provided as an index for a deviation. However, the S/N ratio $\eta$ of the larger-is-better characteristic used in the embodiment of the present invention is obtained by the following equations using a variance $\sigma^2$ of reciprocals of characteristic values $y_1, y_2, \ldots, y_n$:

$$\sigma^2 = (1/n)*(y_1^{-2} + y_2^{-2} + \ldots + y_n^{-2}) \qquad (2)$$

$$\eta = -10*\log(\sigma^2). \qquad (3)$$

The equations show that the larger the S/N ratio η, the larger the effect of the parameter.

The parameter extraction section 23 creates, for each parameter of the second TEG category, an orthogonal array having two levels, a first level which is used for a Mahalanobis reference space and a second level which is not used as a Mahalanobis reference space. The Mahalanobis distance calculation section 21 calculates the Mahalanobis reference spaces corresponding to the first and second levels, respectively, based on the orthogonal array. Furthermore, by using the Mahalanobis reference spaces corresponding to the first and second levels, the Mahalanobis distances D, corresponding to the first and second levels of the second TEG category, are respectively calculated as the characteristic values, and the S/N ratios η of the larger-is-better characteristic is calculated for the first and second levels of each parameter. Since it is determined that the parameter has an affect on the occurrence of the systematic failure when the S/N ratio η of the first level is larger than that of the second level, that is, the gain of the parameter is large, a manufacturing process associated with the parameter having a large gain is extracted as a problem source.

The statistical analysis module 17 transfers the analyzed results to the analysis information storage unit 19 for storage therein. The I/O terminal 20 acquires the analyzed results from the analysis information storage unit 19, and outputs the results to a display or to a printer. In addition, the I/O terminal 20 may acquire the analyzed results directly from the statistical analysis module 17, and may output the results to the display or to the printer.

Figure 8:
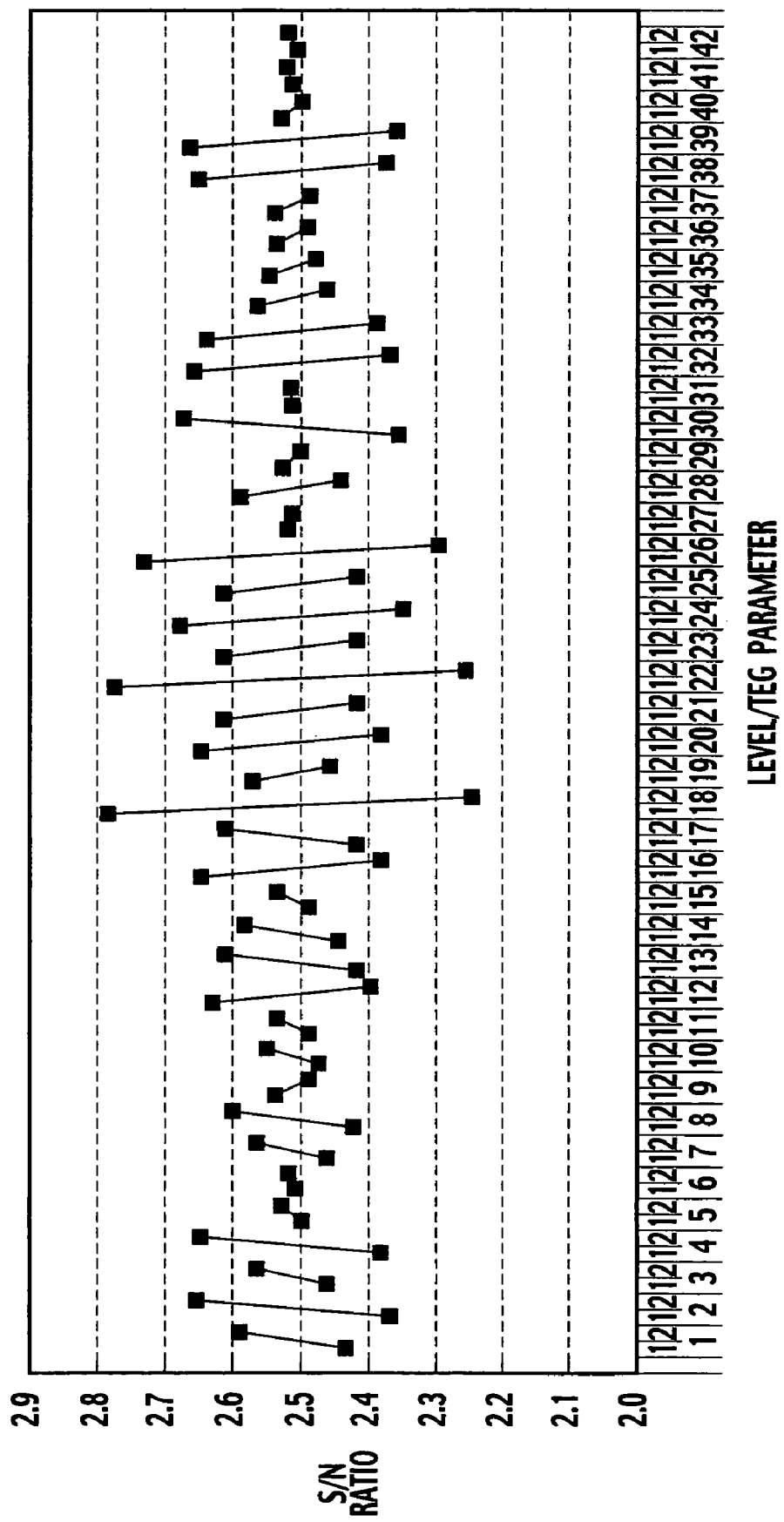
FIG. 8 is a graph showing an example of an S/N ratio obtained by the analysis method according to the embodiment of the present invention.

An example of the respective S/N ratios for the TEG parameters obtained by the analysis system according to the embodiment of the present invention is shown in FIG. 8. The first level (indicated by "1") and second level (indicated by "2") for each TEG parameters (1) to (42) are presented on the abscissa axis. As shown in FIG. 8, parameters having small gains or having a second level which is larger in the S/N ratio than the first level such as the TEG parameters (2) and (4) are excluded from the parameters to be reviewed. The reason for the occurrence of a systematic failure is reviewed for the TEG parameters (18), (22) and (26), which have large gains. For example, if the TEG parameter (18) is the lower layer wiring density, it is determined that there is a problem in the planarization process of the lower layer or the like. Thus, an improvement of the planarization process is reviewed. As described above, according to the analysis system of the embodiment of the present invention, the systematic failure analysis of the TEG can be quickly implemented. Therefore, a problem in the manufacturing process can be detected with high sensitivity.

Figure 9:
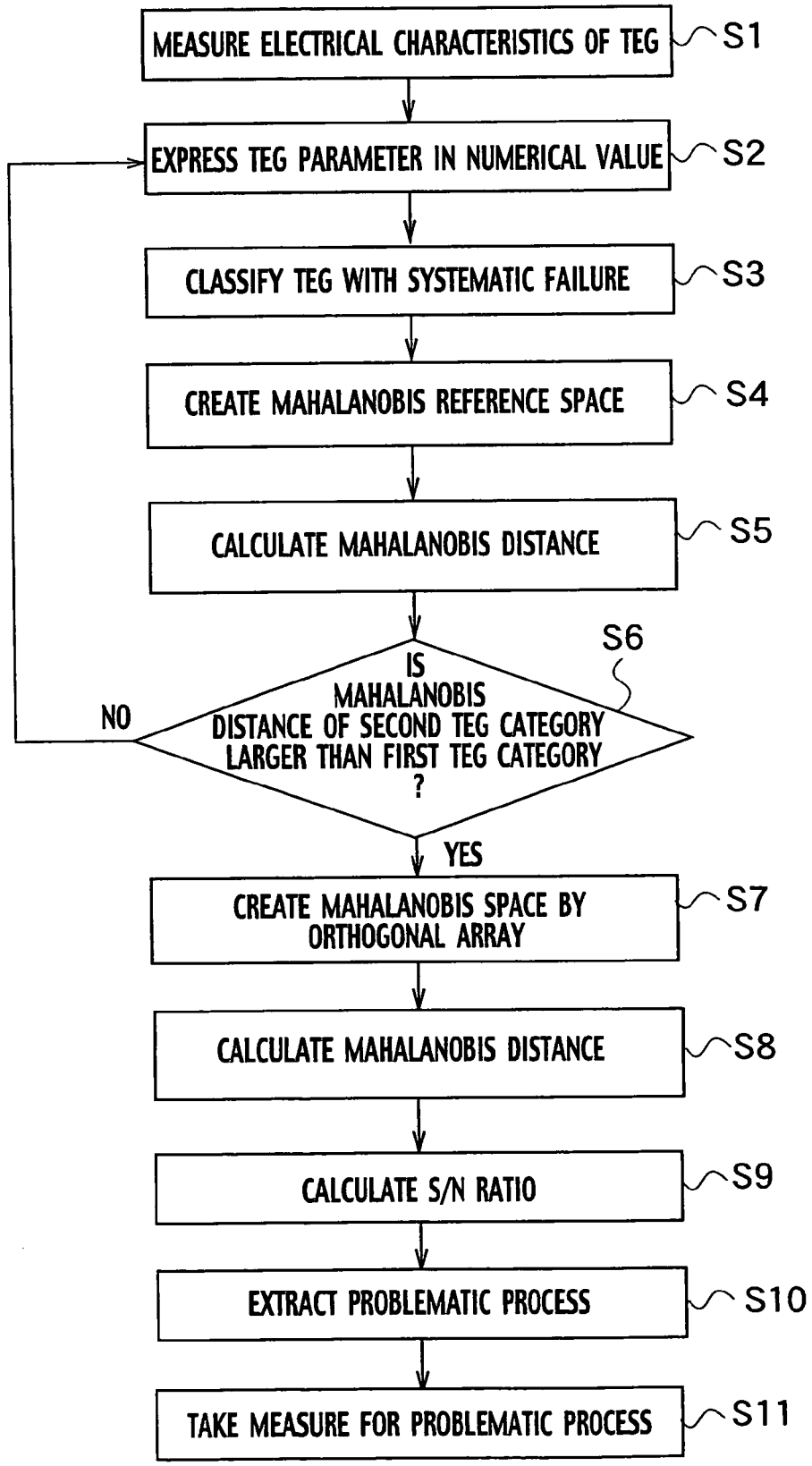
FIG. 9 is a flow chart explaining the analysis method according to the embodiment of the present invention.

Next, an analysis method according to the embodiment of the present invention will be described with reference to a flowchart of FIG. 9.

(a) First, TEGs to be analyzed are fabricated on each of a plurality of chip regions on a semiconductor substrate. In Step S1, electrical characteristics of the TEGs are measured, and measurement results are stored in the measurement information storage unit 13 shown in FIG. 1.

(b) In Step S2, the parameter numeric evaluation module 15 of the operation unit 14 acquires design values from the specification and the design layout stored in the specification database 11 and the design layout database 12, and expresses parameters of the TEGs fabricated on the chip regions as numerical values.

(c) In Step S3, based on the measurement results of the TEGs stored in the measurement information storage unit 13, the failure classification module 16 identifies the TEGs where a systematic failure has occurred due to a manufacturing process of the semiconductor device, according to the manufacturing yield, the failure rate converted by a critical area or the via scale, the deviation of the failure occurrences in the surface of the semiconductor substrate 30, and the like. Then, the failure classification module 16 classifies the first TEG category where the systematic failure has not occurred and the second TEG category where the systematic failure has occurred (d) In Step S4, the Mahalanobis distance calculation section 21 of the statistical analysis module 17 calculates a first comparison Mahalanobis distance of the classified first TEG category by using a comparison Mahalanobis reference space created from values of the parameters of the first TEG category.

(e) In Step S5, the Mahalanobis distance calculation section 21 further calculates a second comparison Mahalanobis distance of the second TEG category by using the comparison Mahalanobis reference space.

(f) In Step S6, the Mahalanobis distance determination section 22 compares the first and second comparison Mahalanobis distances of the first and second TEG categories. If the first and second comparison Mahalanobis distances overlap with each other, the processing returns to Step S2 so as to recalculate the first and second comparison Mahalanobis distances of the first and second TEG categories by adding other parameters of the TEGs.

(g) When it is confirmed that the second comparison Mahalanobis distance is larger than the first comparison Mahalanobis distance by a significant amount, in Step S7 the parameter extraction section 23 creates two levels for each parameter, a first level of which is used for the Mahalanobis reference space and a second level which is not used for the Mahalanobis reference space. Then, the Mahalanobis distance calculation section 21 calculates first and second evaluation Mahalanobis reference spaces corresponding to the first and second levels based on the orthogonal array.

(h) In Step S8, the Mahalanobis distance calculation section 21 recalculates the first and second evaluation Mahalanobis distances, corresponding to the first and second levels of the parameters of the second TEG category by using the first and second evaluation Mahalanobis reference spaces.

(i) The parameter extraction section 23, in Step S9, calculates the S/N ratio η for each parameter by using the recalculated first and second evaluation Mahalanobis distances as characteristic values.

(j) In Step S10, the parameter extraction section 23 extracts a parameter having a large gain from the S/N ratio η of each parameter. In Step S11, based on the extracted parameter, a manufacturing process that causes an occurrence of a systematic failure is reviewed, and a measure is taken to prevent or avoid a problematic process that has caused the occurrence of the systematic failure.

Figure 10:
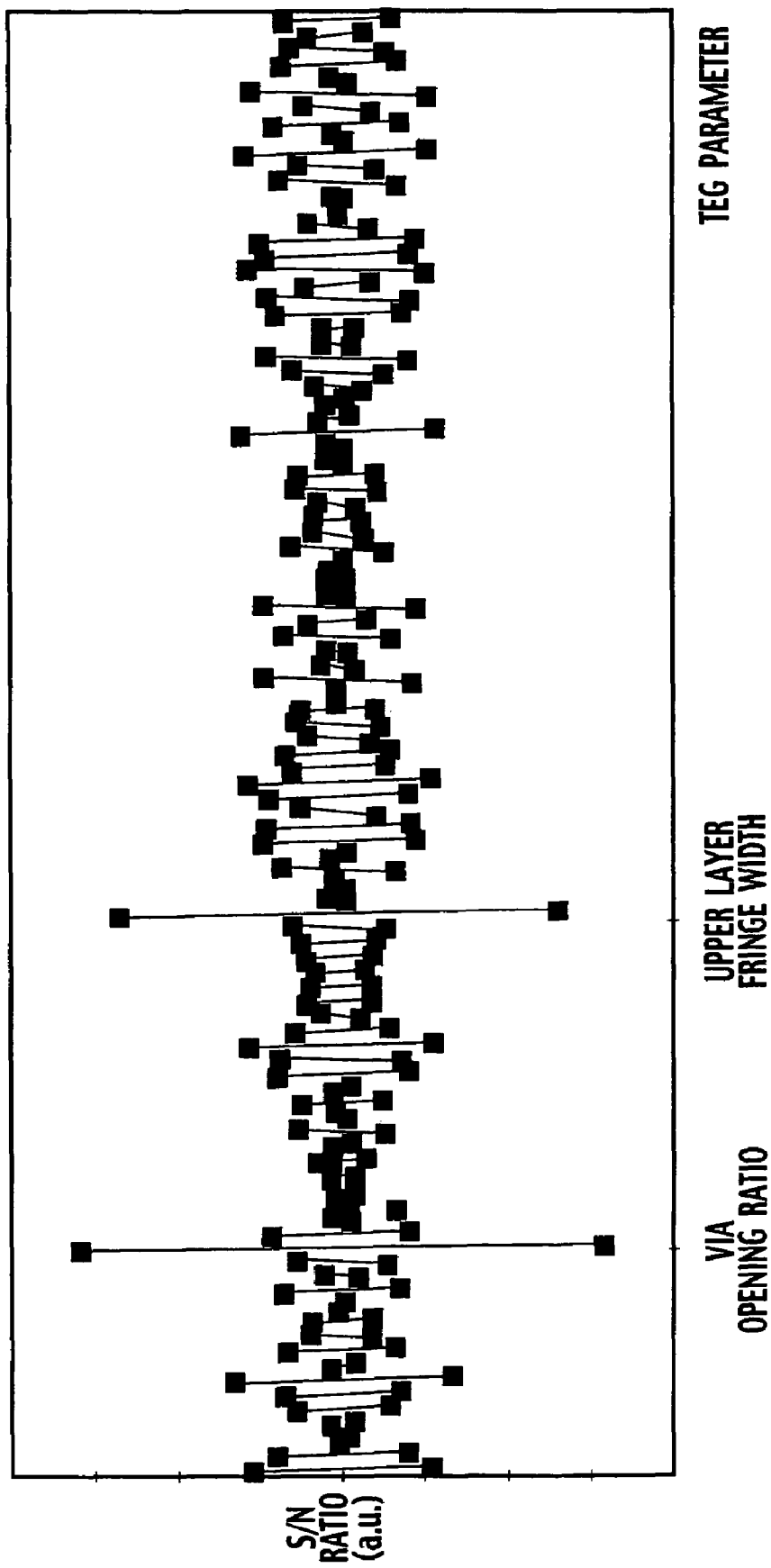
FIG. 10 is a graph showing an example of another S/N ratio obtained by the analysis method according to the embodiment of the present invention.
Figure 11:
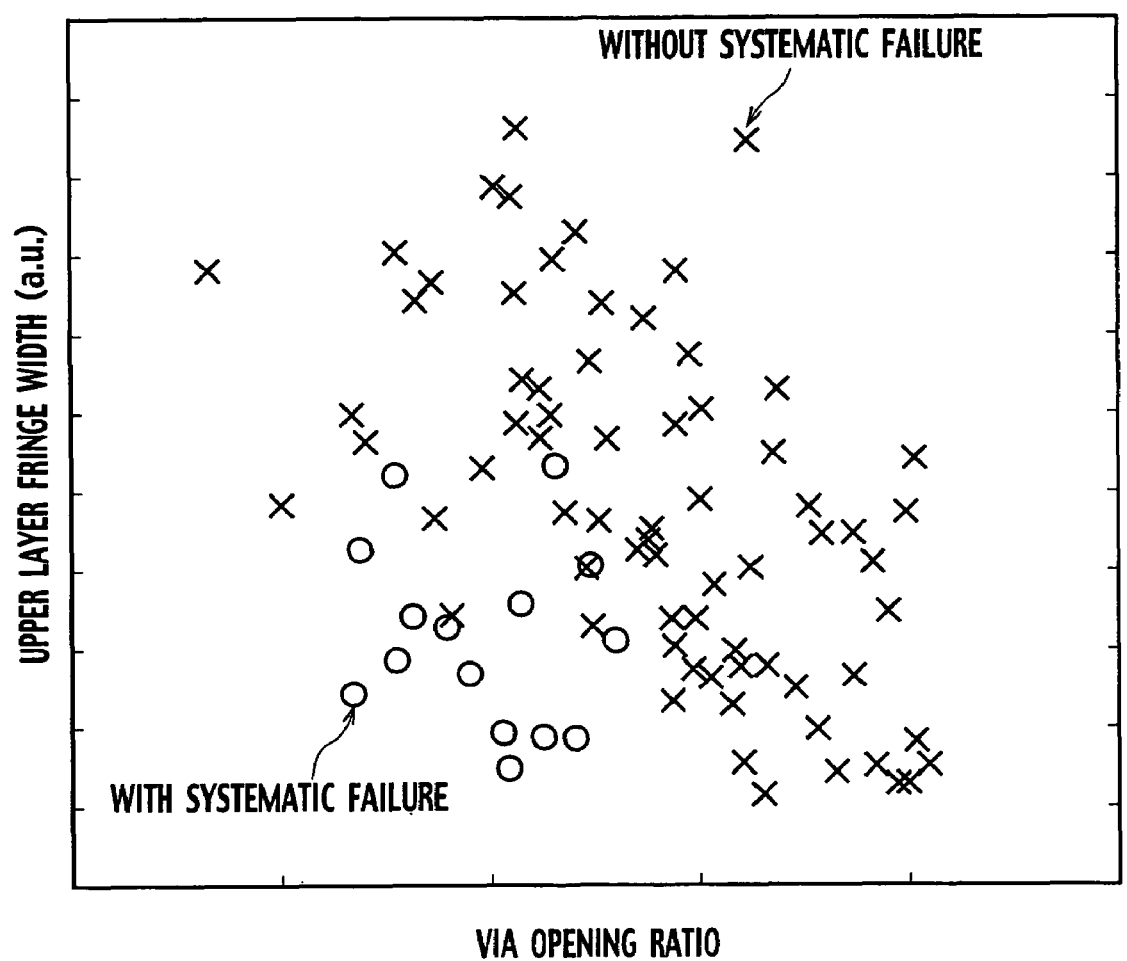
FIG. 11 is a scatter plot showing a relationship between a via-opening ratio and an upper layer fringe width obtained by the analysis method according to the embodiment of the present invention.

By using the analysis method according to the embodiment of the present invention, for example, the graph of the S/N ratio η as shown in FIG. 10 is obtained. Based on the graph of the S/N ratio η, it is determined that the via opening ratio and the upper layer fringe width are strongly associated with the occurrence of the systematic failure. FIG. 11 shows a scatter plot in relation to the parameters of the via-opening ratio and the upper layer fringe width, indicating whether or not the systematic failure has occurred. It is shown that the systematic failures have occurred mainly in the TEGs where both the via opening ratio and the upper layer fringe width are small. As a result, it is determined that when the via opening ratio decreases, a process margin decreases which leads to a change of the via shape. Furthermore, it is determined that when the fringe width decreases, a degradation of an ability to fill via holes with metal is the reason for the generation of voids in the via plugs 54, so that the via chain TEG becomes electrically open. According to the analysis method of the embodiment of the present invention, the failure analysis for the manufacturing process of the semiconductor device and a guideline for improving the manufacturing process by using the TEGs can be quickly provided.

OTHER EMBODIMENTS

While a description was made in the embodiment of the present invention taking the open-short TEG and the via chain TEG as examples of the TEGs fabricated on the chips, needless to say, the TEGs may include transistors having various dimensions and structures, capacitors having various areas, and the like. Various modifications will become possible for those skilled in the art after receiving the teachings of the present disclosure without departing from the scope thereof.

What is claimed is:

1. An analysis method for a semiconductor device, comprising:
    measuring electrical characteristics of a plurality of test element groups fabricated on a semiconductor substrate;
    classifying the test element groups into a first test element group category where a systematic failure has not occurred and a second test element group category where the systematic failure has occurred based on the electrical characteristics;
    creating a first comparison Mahalanobis reference space using first parameters of the test element groups in the first test element group category from among parameters of the test element groups expressed as numerical values;
    calculating a first comparison Mahalanobis distance of the first parameters and a second comparison Mahalanobis distance of second parameters of the test element groups in the second test element group category by using the first comparison Mahalanobis reference space; and
    comparing the first and second comparison Mahalanobis distances.

2. The analysis method of claim 1, wherein when no significant difference between the calculated first and second comparison Mahalanobis distances is determined, the method repeats loop processing which includes:
    creating a second comparison Mahalanobis reference space using the first parameters after adding another parameter expressed as a numerical value, to each of the first and second parameters;
    recalculating a third comparison Mahalanobis distance of the first parameters and a fourth comparison Mahalanobis distance of the second parameters, using the second comparison Mahalanobis reference space; and
    comparing the third and fourth comparison Mahalanobis distances, the loop processing being repeated until a significant difference between the third and fourth comparison Mahalanobis distances is determined.

3. The analysis method of claim 2, wherein when one of differences between the first and second comparison Mahalanobis distances, and between the third and fourth comparison Mahalanobis distances provides a significant difference, the method further comprises:
    creating an orthogonal array having two levels for each of the parameters of the test element groups, a first level of which has been used for creating a first evaluation Mahalanobis reference space, and a second level of which has not been used for creating the first evaluation Mahalanobis reference space;
    creating the first evaluation Mahalanobis reference space and a second evaluation Mahalanobis reference space of the second parameters corresponding to the first and second levels based on the orthogonal array;
    calculating first and second evaluation Mahalanobis distances of the second parameters by using the first and second evaluation Mahalanobis reference spaces; and
    obtaining a signal to noise ratio from the first and second evaluation Mahalanobis distances as characteristic values.

4. The analysis method of claim 3, further comprising:
    extracting a third parameter having a large gain of signal to noise ratio from the signal to noise ratio for each of the parameters, and
    reviewing a manufacturing process which resulted in an occurrence of the systematic failure based on the third parameter.

5. The analysis method of claim 1, wherein the test element groups include at least one of an open-short test element group to inspect open and short wiring failures and a via chain test element group connected in a chain shape by via plugs between multilevel wirings.

6. The analysis method of claim 5, wherein the parameters of the open-short test element group include at least one of a line length, a line width, a space width between lines, a wiring density including any surrounding region, a wiring coverage rate, a coordinate of the open-short test element group in a chip region, a coordinate of the chip region on the semiconductor substrate, wiring densities of the test element groups placed on an upper layer and a lower layer of the open-short test element group, and wiring coverage rates of the test element groups placed on the upper layer and the lower layer.

7. The analysis method of claim 5, wherein the parameters of the via chain test element group include at least one of a line length, a line width, a space width between lines, a wiring density including any surrounding region, a wiring coverage rate, a coordinate of the via chain test element group in the chip region, a coordinate of the chip region on the semiconductor substrate, wiring densities of the test element groups placed on an upper layer and a lower layer of the via chain test element group, wiring coverage rates of the test element groups placed on the upper layer and the lower layer, a lower layer fringe width of a via, an upper layer fringe width of the via, a via period, a via scale, and a via opening ratio.

8. The analysis method of claim 1, wherein the first and second test element group categories are classified by using a manufacturing yield of the test element groups in the semiconductor substrate, a failure rate converted by a critical area or a via scale, and a deviation in the occurrence of a failure in a surface of the semiconductor substrate.

9. The analysis method of claim 1, wherein the test element groups are placed in the chip region of the semiconductor substrate.

10. The analysis method of claim 1, wherein the test element groups are placed in a dicing line of the semiconductor substrate.

11. An analysis system, comprising:
    a failure classification module configured to classify test element groups into a first test element group category where a systematic failure has not occurred and a second test element group category where the systematic failure has occurred based on measurement results of electrical characteristics of the test element groups; and a statistical analysis module configured to create a first comparison Mahalanobis reference space using first parameters of the test element groups in the first test element group category from among parameters of the test element groups expressed as numerical values, and to calculate a first comparison Mahalanobis distance of the first parameters and a second comparison Mahalanobis distance of second parameters of the test element groups in the second test element group category by using the first comparison Mahalanobis reference space, so as to compare the first and second comparison Mahalanobis distances.

12. The analysis system of claim 11, wherein when no significant difference between the first and second comparison Mahalanobis distances is determined, the statistical analysis module recalculates a third comparison Mahalanobis distance of the first parameters and a fourth comparison Mahalanobis distance of the second parameters using a second comparison Mahalanobis reference space of the first parameters which is created by loop processing, adding another parameter expressed as a numerical value to each of the first and second parameters, so as to compare the third and fourth comparison Mahalanobis distances, the loop processing repeats until a significant difference between the third and fourth comparison Mahalanobis distances is determined.

13. The analysis system of claim 11, wherein the statistical analysis module creates an orthogonal array having two levels for each of the parameters of the test element groups, a first level of which has been used for creating a first evaluation Mahalanobis reference space, and a second level of which has not been used for creating the first evaluation Mahalanobis reference space, creates the first evaluation Mahalanobis reference space and a second evaluation Mahalanobis reference space of the second parameters corresponding to the first and second levels based on the orthogonal array, calculates first and second evaluation Mahalanobis distances of the second parameters by using the first and second evaluation Mahalanobis reference spaces, and obtains a signal to noise ratio from the first and second evaluation Mahalanobis distances as characteristic values.

14. The analysis system of claim 13, further comprising a parameter extraction section configured to extract a third parameter having a large gain of signal to noise ratio from the signal to noise ratio for each of the parameters.

15. The analysis system of claim 11, further comprising a parameter storage unit configured to store data of a specification and a design layout in a specification database and a design layout database.

16. The analysis system of claim 11, further comprising a measurement information storage unit configured to store the measurement results of the electrical characteristics of the test element groups.

17. A computer program product configured to be executed by a computer, comprising:
   an instruction of classifying test element groups into a first test element group category where a systematic failure has not occurred and a second test element group category where the systematic failure has occurred based on measurement results of electrical characteristics of the test element groups;
   an instruction of creating a first comparison Mahalanobis reference space using first parameters of the test element groups in the first test element group category from among parameters of the test element groups expressed as numerical values; and
   an instruction of calculating a first comparison Mahalanobis distance of the first parameters and a second comparison Mahalanobis distance of second parameters of the test element groups in the second test element group category by using the first comparison Mahalanobis reference space so as to compare the first and second comparison Mahalanobis distances.

18. The computer program product of claim 17, further comprising repeating loop processing when no significant difference between the calculated first and second comparison Mahalanobis distances is determined, including:
   an instruction of creating a second comparison Mahalanobis reference space using the first parameters after adding another parameter expressed as a numerical value, to each of the first and second parameters;
   an instruction of recalculating a third comparison Mahalanobis distance of the first parameters and a fourth comparison Mahalanobis distance of the second parameters, using the second comparison Mahalanobis reference space; and
   an instruction of comparing the third and fourth comparison Mahalanobis distances, the loop processing being repeated until a significant difference between the third and fourth comparison Mahalanobis distances is determined.

19. The computer program product of claim 17, further comprising:
   an instruction of creating an orthogonal array having two levels for each of the parameters of the test element groups, a first level of which has been used for creating a first evaluation Mahalanobis reference space, and a second level of which has not been used for creating the first evaluation Mahalanobis reference space;
   an instruction of creating the first evaluation Mahalanobis reference space and a second evaluation Mahalanobis reference space of the second parameters corresponding to the first and second levels based on the orthogonal array;
   an instruction of calculating first and second evaluation Mahalanobis distances of the second parameters by using the first and second evaluation Mahalanobis reference spaces; and
   an instruction of obtaining a signal to noise ratio from the first and second evaluation Mahalanobis distances as characteristic values.

20. The computer program product of claim 19, further comprising:
   an instruction of extracting a third parameter having a large gain of a signal to noise ratio from the signal to noise ratio for each of the parameters; and
   an instruction of reviewing a manufacturing process which resulted in an occurrence of the systematic failure based on the extracted parameter.

* * * * *